United States Patent [19]
Miller

[11] Patent Number: 5,696,951
[45] Date of Patent: Dec. 9, 1997

[54] SIGNAL DESKEWING SYSTEM FOR SYNCHRONOUS LOGIC CIRCUIT

[75] Inventor: Charles A. Miller, Fremont, Calif.

[73] Assignee: Credence Systems Corporation, Fremont, Calif.

[21] Appl. No.: 582,448

[22] Filed: Jan. 3, 1996

[51] Int. Cl.$^6$ .................................................. G06F 1/12
[52] U.S. Cl. ............................................ 395/558; 327/161
[58] Field of Search ........................ 395/551, 552, 395/556, 558; 327/141, 144, 152, 153, 161, 291, 295; 331/1 R, 60, 175

[56] References Cited

U.S. PATENT DOCUMENTS

| | | |
|---|---|---|
| 3,496,477 | 2/1970 | Page . |
| 4,447,870 | 5/1984 | Tague et al. . |
| 4,931,986 | 6/1990 | Daniel et al. ............... 395/556 |
| 5,086,500 | 2/1992 | Greub ........................... 395/552 |
| 5,293,626 | 3/1994 | Priest et al. ................... 395/552 |
| 5,298,866 | 3/1994 | Kaplinsky . |
| 5,305,451 | 4/1994 | Chao et al. . |
| 5,361,277 | 11/1994 | Grover . |
| 5,369,640 | 11/1994 | Watson et al. . |
| 5,388,249 | 2/1995 | Hotta et al. ................... 395/553 |
| 5,455,935 | 10/1995 | Taylor et al. ................. 395/552 |
| 5,465,347 | 11/1995 | Chao et al. ................... 395/552 |

*Primary Examiner*—Thomas M. Heckler
*Attorney, Agent, or Firm*—Smith-Hill and Bedell

[57] ABSTRACT

A global clock signal is distributed from its source to each module of a distributed synchronous logic circuit via two separate transmission lines. Portions of the two transmission lines extending between the clock signal source and each module are of similar length but have dissimilar velocities of signal propagation. A resulting phase difference between corresponding pulses of the global clock signal arriving at each module via the two transmission lines is proportional to the length of the transmission lines, and is therefore proportional to the inherent clock signal delay in either transmission line. A deskewing circuit at each module further delays the global clock signal after it arrives at the module on a first of the two transmission lines to produce a local clock signal at the module. The deskewing circuit at each module detects the phase difference between global clock signal pulses arriving at the module on the two transmission lines to determine the inherent delay of the first transmission line and then adjusts the local clock delay so that the sum of the inherent delay and local clock delay equals a standard delay. With the standard delay the same for all modules, the local clock signals produced at all modules are in phase with one another.

25 Claims, 5 Drawing Sheets

SIGNAL DESKEWING SYSTEM FOR SYNCHRONOUS LOGIC CIRCUIT

BACKGROUND OF THE INVENTION

1. Field of the Invention

The present invention relates to a system for deskewing and/or time compensating signals conveyed between a signal source and distant operating modules of a digital system.

2. Description of Related Art

In a synchronous digital logic circuit formed by a set of interconnected operating modules, one of the signals distributed to each module is a clock signal for controlling the timing of operations between the modules. For example a computer may include several circuit boards mounted in a chassis and interconnected by backplane wiring to a mother board containing a central processor and a clock signal source. Typically, one of the conductors in the backplane carries a clock signal to each circuit board. In some synchronous systems, it is desirable to synchronize the reference signal in relative time such that the reference signal path delays do not introduce timing latencies (signal skew) in the system.

Signal skew can also be a problem in electronic instruments having distributed components that must operate together in a synchronous manner. For example, an integrated circuit (IC) tester may include a host unit and multiple operating modules connected to the host unit. Each operating module may provide an interface to a separate pin of an IC under test. At various times, an operating module may transmit a test signal to an IC pin or may acquire output data produced by the IC at the pin. One of the functions of the host unit is to coordinate the actions of the operating modules. In order to synchronize the time of arrival of the signals to the Device Under Test (DUT), signal skew among the modules must be removed. For example, to signal the start of a test, the host unit may transmit a "start" signal to each operating module. The host unit may also transmit a clock signal to each operating module to synchronize the actions of the operating modules during the test and to synchronize communications between the host and the modules during the test. If the clock and other control signals travel varying distances to reach the operating modules they arrive at the various modules at different times. Such varying control and clock signal skew, if sufficiently large with respect to the operating frequency of the tester, can result in a timing mismatch between module operations and can adversely affect synchronous arrival of signals from the modules to the DUT.

U.S. Pat. No. 5,369,640 issued Nov. 29, 1994 to Watson et al, describes a system for reducing skew in a signal sent to remote operating modules by providing a separate transmission line from the source to each operating module and by adjusting the transmission lines so that they all have the same length. However this "star bus" solution to the signal skew problem can be somewhat unwieldy in systems having a large number of operating modules because it requires so many transmission lines to be connected to the signal source.

Another method for eliminating signal skew is described in U.S. Pat. No. 4,447,870 issued May 8, 1984 to Tague et al. Here an adjustable delay circuit is provided on each operating module for further delaying the clock signal after it arrives at the operating module. The delay circuit in each operating module is adjusted so that the sum of delays provided by the clock signal transmission line and the adjustable delay circuit is equal to a standard delay. This method allows the clock signal to be delivered to the operating modules through a single transmission line connected to all operating modules as in a backplane. However it requires a time-consuming and difficult process of manually calibrating the delay circuit in each operating module. Also whenever an operating module is moved to a new position along the transmission line its clock delay circuit must be readjusted.

SUMMARY OF THE INVENTION

A deskewing system in accordance with the invention provides a local clock signal at each distributed module of a digital system in response to a global reference signal generated by a single signal source. The global signal is delivered from its source to each module via two separate transmission lines of similar length but having dissimilar velocities of signal propagation. A phase difference between the two global signals arriving at each module via the two transmission lines is proportional to the length of the transmission lines, and is therefore proportional to the inherent clock signal delay in either transmission line. A deskewing circuit at each module further delays the global clock signal after it arrives at the module on a first of the two transmission lines to produce a local clock signal at the module. The deskewing circuit detects the phase difference between corresponding global reference signals arriving at the module on the two transmission lines to determine the inherent delay of the first transmission line. The deskewing circuit then adjusts the local clock delay so that the sum of the inherent transmission line delay and local clock delay equals a standard delay. With the standard delay the same for all modules, the local clock signals produced at all modules are in phase with one another.

It is accordingly an object of the present invention to provide a system for closely synchronizing operations of separate modules of a synchronous logic circuit system.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS(S)

DESCRIPTION OF THE PREFERRED EMBODIMENT(S)

Figure 1:
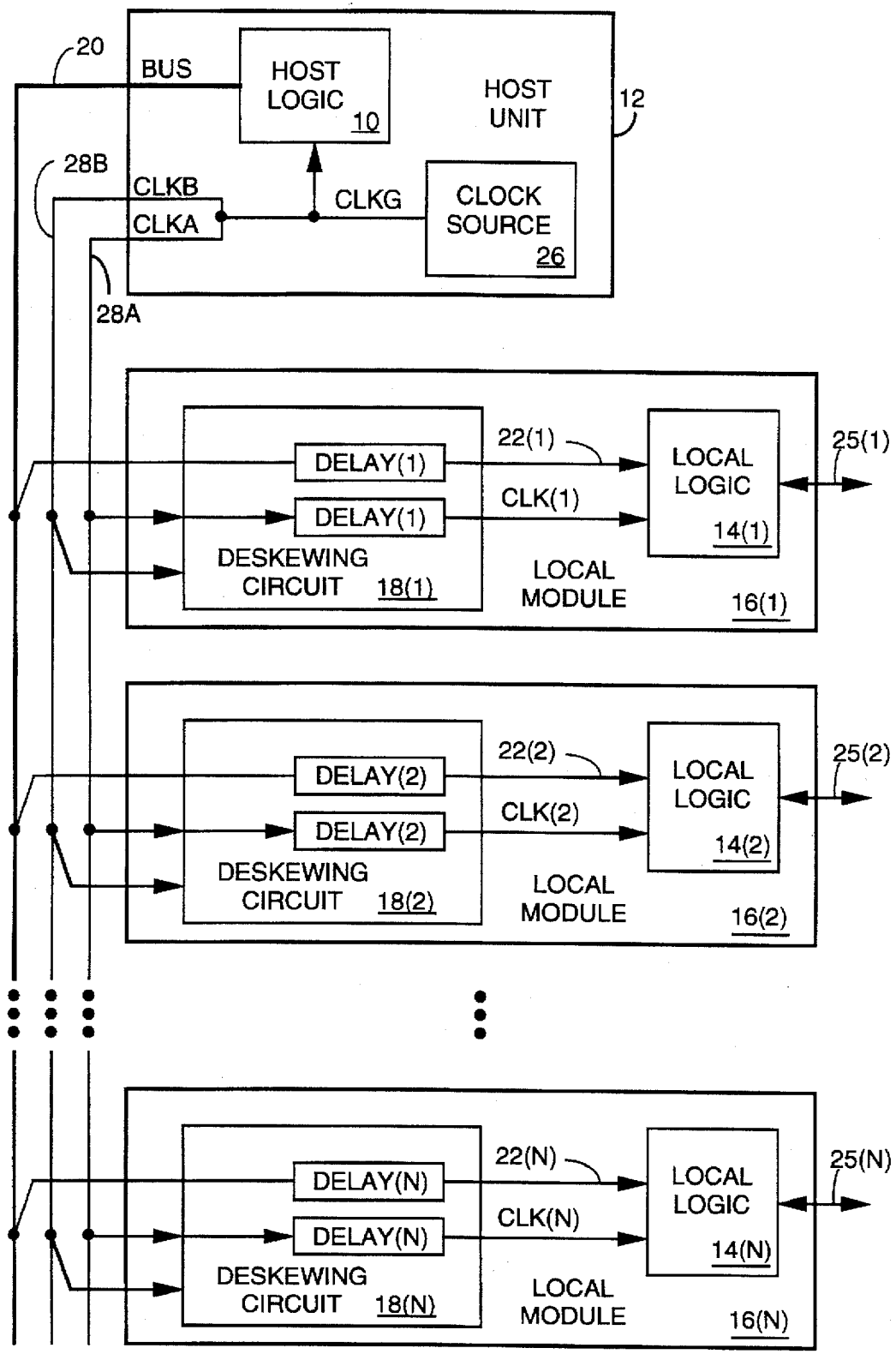
FIG. 1 illustrates in block diagram form a modular synchronous logic circuit employing a signal deskewing system in accordance with the present invention.

Referring to FIG. 1, the present invention relates to a system for deskewing signals transmitted between a host logic circuit 10 within a host unit 12 and a distributed set of N local logic circuits 14(1)–14(N) within operating modules 16(1)–16(N) of a synchronous logic system. The operating modules 16 are located at varying distances from host logic circuit 10. Host logic circuit 10 and local logic circuits 14 are application dependent. For example the logic system may be a computer wherein the host logic circuit 10 is a conventional microprocessor and the local logic circuits 18 are memories, peripheral I/O controllers or other devices which communicate with the computer processor in a synchronous fashion. System 10 could also, for example, be a distributed architecture integrated circuit tester wherein each local logic circuit 14 provides an interface to a separate pin of an integrated circuit device under test. At various times during a test, an operating module may transmit test signals to terminals of the device under test 25(1)–25(N) or may acquire output data produced by the IC at the pin. The host unit provides control signals and instructions to the operating modules.

In typical synchronous logic systems a global clock signal is sent concurrently to each local logic circuit for synchronizing their operations. Since the local logic circuits are distributed in space, pulses of a clock signal originating at a common clock signal source may not arrive at the local logic circuits at the same time. This is particularly true when the local logic circuits acquire the global clock signal by tapping a common transmission line at different locations. A difference in delay ("skew") between the time a clock signal pulse leaves the clock source and the time the pulse arrives at the various local logic circuits affects their ability to operate synchronously with one another. The present invention compensates for clock signal skew to provide local clock signals at each local logic circuit 14 that are in phase with one another. The signal distribution system also compensates for skew in control and communication signals transmitted between the host logic circuit 10 and local logic circuits 14 due to differences in signal path length.

Accordingly, the deskewing system of the present invention includes a set of N deskewing circuits 18(1)–18(N) each mounted within a corresponding one of operating modules 16(1)–16(N). The deskewing system also includes a control signal bus 20 for conveying communication and/or control signals between the host logic circuit 10 and each deskewing circuit 18. Bus 20 employs a transmission path having the same velocity of propagation as the CLKA [28(A)] transmission path. The Ith deskewing circuit 18(I) provides an interface between the corresponding Ith local logic circuit 14(I) and bus 20, where "I" is any number from 1 to N. Output signals generated by the host logic circuit 10 pass via bus 20 to each deskewing circuit 18(I) which delivers them through an adjustable delay DELAY(I) as input signals 22 to the corresponding local logic circuit 14(I).

The signal distribution system of the present invention also includes a clock source 26 and a pair of transmission lines 28A and 28B tied together at clock source 26, each interconnecting clock source 26 to deskewing circuits 18. Clock source 26 concurrently places a periodic global clock signal CLKG on each transmission line 28A and 28B. Lines 28A and 28B deliver the global clock signal as separate clock signals CLKA and CLKB, respectively, to deskewing circuits 18. Each deskewing circuit 18 taps transmission lines 28A and 28B at similar distances along lines 28A and 28B. The CLKA and CLKB signals arrive at a given (Ith) deskewing circuit 18(I) before they arrive at deskewing circuit 18(I+1). However in traveling between clock source 26 and the Ith deskewing circuit 18(I) the CLKA signal travels substantially the same distance along line 28A as the CLKB signal travels along line 28B.

In accordance with the invention, transmission lines 28A and 28B have differing velocities of signal propagation. In particular the velocity of propagation of the CLKA signal on line 28A is M times faster then the velocity of propagation of the CLKB signal on line 28B, where M is a number greater than 1. Thus despite the fact that they travel the same distance, a pulse of the CLKA signal arrives at the Ith deskewing circuit 18(I) before a corresponding pulse of the CLKB signal. The time delay between arrivals of corresponding pulses of the CLKA signal and CLKB signal at deskewing circuit 18(I) is proportional to the length of transmission lines 28A and 28B between the clock source 20 and deskewing circuit 18(I). Thus the phase difference between CLKA and CLKB is a measure of transmission line length from source 26 to the points along lines 28A and 28B at which deskewing circuit 18(I) detects CLKA and CLKB.

Bus 20 includes one or more transmission lines having similar velocities of propagation to that of transmission line 28A. The distance along bus 20 between host logic circuit 10 and any deskewing circuit 18(I) is substantially the same distance as the distance along transmission line 28A between clock source 26 and deskewing circuit 18(I). When signal pulses concurrently depart logic circuit 10 on bus 20 and clock source 26 on line 28 they arrive at deskewing circuit 18(I) at the same time because they travel the same distance and have the same velocity of propagation.

Each deskewing circuit 18(I) derives a local clock signal CLK(I) from the CLKA and CLKB signals and supplies the local clock signal CLK(I) as an input to its corresponding local logic circuit 14(I). The deskewing circuits 18 ensure that the local clock signals CLK(1)–CLK(N) are all substantially in phase with one another. The local logic circuits 14(1)–14(N) use them as timing signals for synchronizing their operations including reception of local input signals 24(1)–24(N).

Each deskewing circuit 18(I) produces its local clock signal CLK(I) by delaying its input CLKA signal by an adjustable delay time DELAY(I). The closer the deskewing circuit 18(I) is to clock source 26 the longer the deskewing circuit 18(I) delays the CLKA signal to produce its local clock signal CLK(I) output. In particular each deskewing circuit 18(I) delays CLKA by an amount of time that is sufficient to bring all local clock signals CLKL(1)–CLKL(N) into phase with one another.

Each deskewing circuit 18(I) determines the amount of time to delay the CLKA signal by first measuring the period between arrivals of corresponding pulses of the CLKA and CLKB signals. This measured period is proportional to the length of transmission line 28A (or 28B) from the clock source 26 to the deskewing circuit 18(I) and is therefore also proportional to the time D(I) required for the CLKA signal to travel from clock source 26 to the deskewing circuit 18(I). DELAY(I) is then adjusted so that the sum of D(I) and DELAY(I) equals a constant total delay TD:

$$\begin{aligned} \text{SKEW}(I) &= TD \\ &= D(I) + \text{DELAY}(I) \\ &= \text{CONSTANT} \end{aligned}$$

SKEW(I) is the skew of the local clock signal CLK(I) with respect to the global clock signal at source 26.

Each deskewing circuit 18(I) also delivers local input signals 22(I) to local logic circuit 14(I) from lines of bus 20 through the same delay DELAY(I). Thus a signal originating at host logic circuit 10 arrives as local input signal 22(I) at all local logic circuits 14(I) at the same time.

Figure 2:
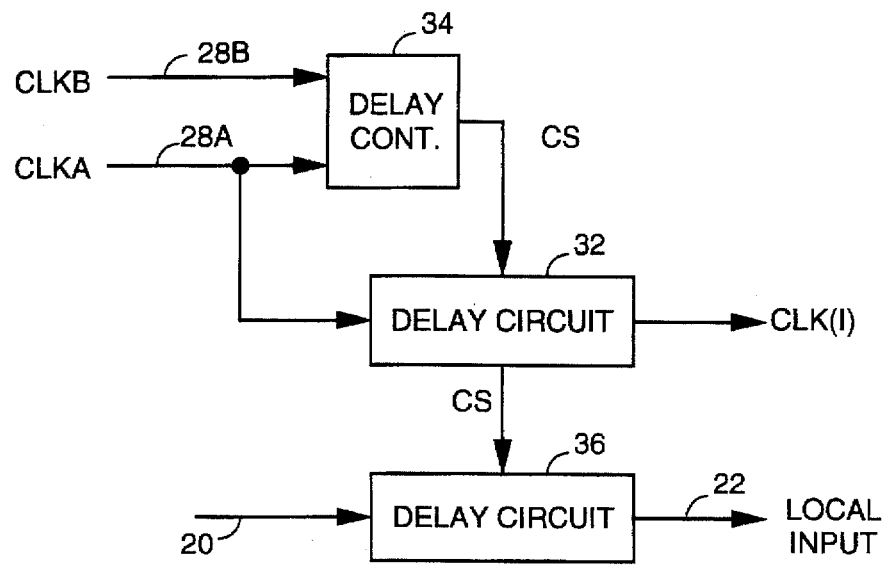
FIG. 2 illustrates a deskewing circuit of FIG. 1 in more detailed block diagram form.

Referring to FIG. 2, in accordance with a preferred embodiment of the invention, deskewing circuit 18(I) of FIG. 1 includes a delay circuit 32 for adjustably delaying the CLKA signal by DELAY(I) to produce the local clock signal CLK(I) signal. A delay controller 34 measures that phase difference and produces an output signal CS appropriately adjusting the delay, DELAY(I), of delay circuit 32. The CS signal is also applied as the delay control input to delay circuits 36 which are similar in construction to delay circuit 32 and provide similar delays, DELAY(I), in response to the CS signal. Delay circuit 36 delays a signal arriving on a line of bus 20 to provide a local input signal 22(I) to the local logic circuit 14(I) of FIG. 1. For simplicity, only one delay circuit 36 is shown in FIG. 2; similar delay circuits controlled by the CS signal may be provided as needed to link each line of bus 20 to an input and/or an output of the local logic circuit.

Figure 3:
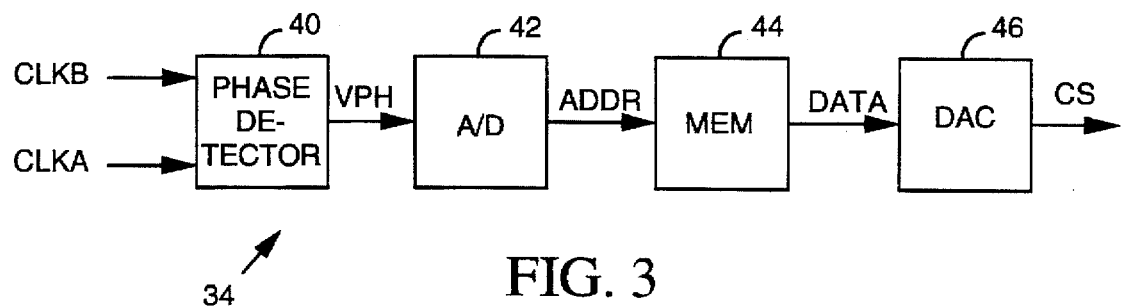
FIG. 3 illustrates the delay control circuit of FIG. 2 in more detailed block diagram form.

FIG. 3 illustrates one embodiment of delay controller 34. Delay controller 34 includes a phase detector 40 receiving the CLKA and CLKB signals and producing therefrom an output signal VPH having a voltage proportional to the phase difference between CLKA and CLKB. An analog-to-digital converter 42 converts the VPH signal to a digital value ADDR of similar magnitude. ADDR addresses an addressable memory 44 storing control data (DATA) at each address and supplying its currently addressed DATA to a digital-to-analog converter 46. DAC 46 produces the CS signal of magnitude proportional to the magnitude of DATA. The data stored at each address in memory 44 is adjusted so that for any given phase difference between CLKA and CLKB the CS signal has a magnitude providing the appropriate delay in delay circuit 32. Such stored DATA values can be determined by using an oscilloscope or other phase detection apparatus to monitor the phase relationship between the global clock signal CLKG and the local clock signal CLK(I) and by iteratively adjusting the DATA until CLK(I) and CLKG have a desired phase relation for each value of ADDR.

Figure 4:
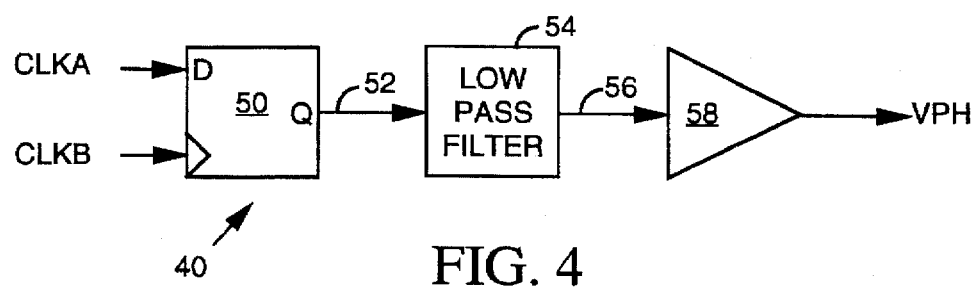
FIG. 4 illustrates, in block diagram form, a prior art circuit suitable for use the phase detector circuit of FIG. 2.

FIG. 4 illustrates a well-known prior art phase detector circuit suitable for use as phase detector 40 of FIG. 2. A D type flip-flop 50 drives its output signal 52 high when CLKA leads CLKB and low when CLKA lags CLKB. A low pass filter 54 filters signal 52 to provide an input to an amplifier 58. Amplifier 58 produces the VPH signal output in response to its input signal 56. The magnitude of VPH is proportional to the phase difference between CLKA and CLKB.

Figure 5:
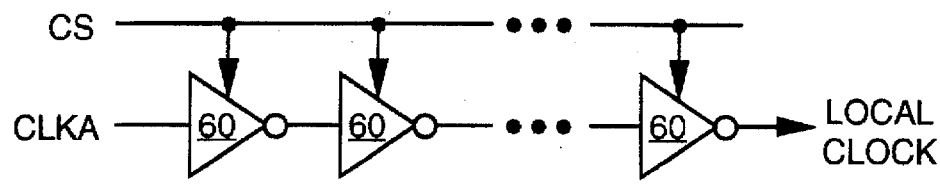
FIG. 5 illustrates, in block diagram form, a prior art delay circuit.

FIG. 5 illustrates a well-known delay circuit suitable for use as delay circuit 32 of FIG. 1. Delay circuit 32 comprises a set of inverters 60 connected in series, the CLKA signal being supplied to the input of a first inverter of the series and the local clock signal CLK(I) being produced at the output of the last inverter of the series. The CS signal supplies power to the inverters. As the CS signal magnitude increases so too does the signal propagation rate of each inverter 60, thereby decreasing the delay of delay circuit 32.

Figure 6:
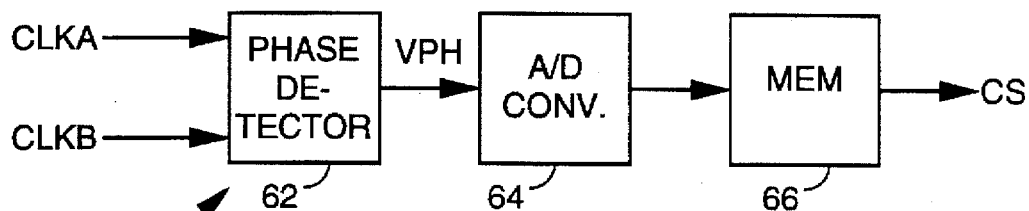
FIG. 6 illustrates, in block diagram form, an alternative embodiment of the delay control circuit of FIG. 2.
Figure 7:
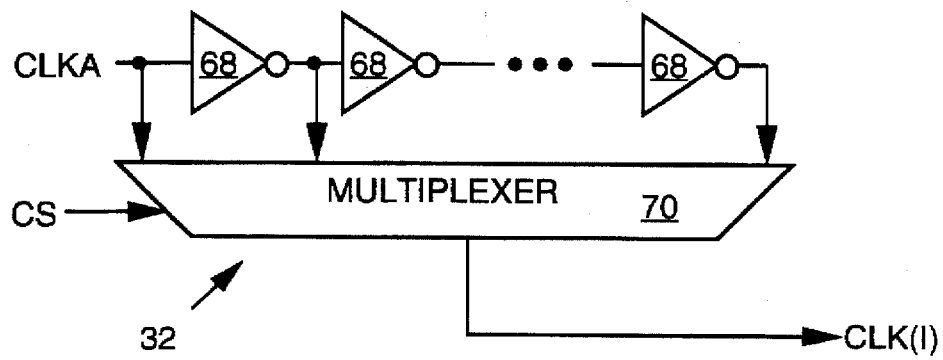
FIG. 7 illustrates, in block diagram form, a prior art delay circuit.

FIGS. 6 and 7 illustrate alternative embodiments of delay controller 34 and delay circuit 32. Referring to FIG. 5, delay controller 34 comprises a phase detector 62, an A/D converter 64 and a memory 66 similar to phase detector 40, A/D converter 42 and memory 44 of FIG. 2. However in this embodiment the CS signal supplied to delay circuit 32 is a digital data signal produced by memory 64 in the same fashion that memory 44 of FIG. 2 produces its output DATA signal. Referring to FIG. 7, the alternative delay circuit 32 comprises a set of inverters 68 connected in series, the CLKA signal being supplied as input to the first inverter of the series. A multiplexer 68 controlled by the digital CS output of memory 66 of FIG. 6 selects the output of one of inverters 66 to be the output local clock signal CLK(I). Values for conversion data stored in memory 64 may be established experimentally in the manner described herein above for ascertaining values of conversion data to be stored in memory 44 of FIG. 2. The embodiment of delay circuit 32 illustrated in FIG. 7 is well-known to those skilled in the art.

Figure 8:
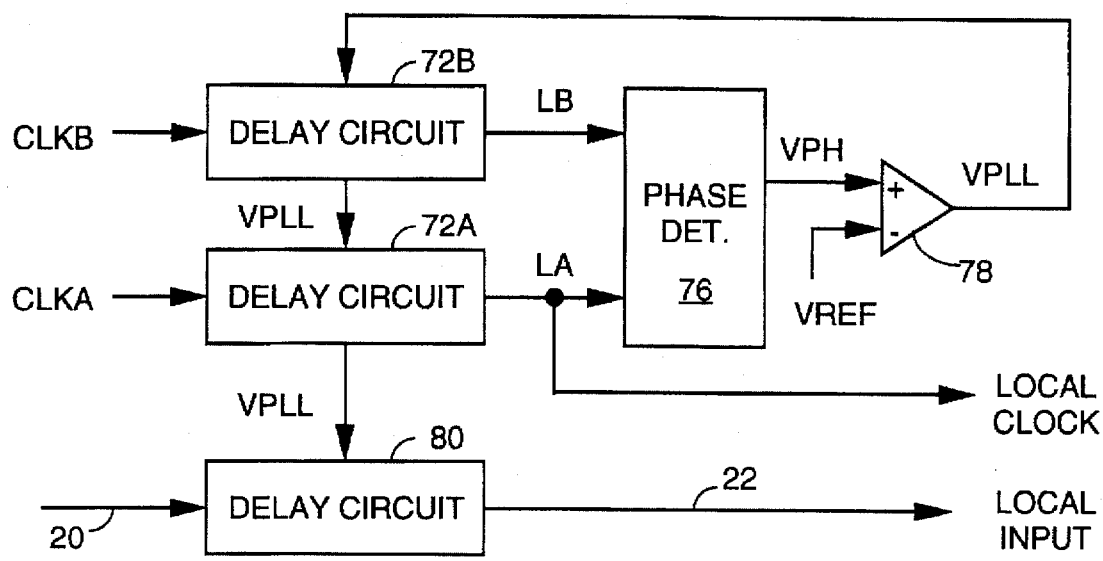
FIG. 8 illustrates, in block diagram form, an alternative embodiment of the deskewing circuit of FIG. 1.

FIG. 8 illustrates an alternative embodiment 70 of deskewing circuit 30(I) of FIG. 1. Deskewing circuit 70 includes a pair of delay circuits 72A and 72B. Delay circuit 72A delays CLKA to produce a first local clock LA. (Clock LA is used as the output local clock signal CLK(I).) Delay circuit 72B delays CLKB to produce a second local clock signal LB. The LA and LB signals are supplied as inputs to a phase detector 76 (similar to phase detector 40 of FIG. 4) which produces output signal VAB having a voltage proportional to the phase difference between LA and LB. A differential amplifier 78 compares the VAB signal to a fixed voltage reference signal VREF and produces an output signal VPLL having a magnitude proportional to a difference between VAB and VREF. The VPLL signal is supplied in common as the control input to both delay circuits 72A and 72B.

Delay circuits 72A and 72B vary in a similar manner. As VPLL increases, the delay provided by both delay circuits 72A and 72B decreases. However, for any given magnitude of VPLL, the delay provided by delay circuit 72B is M times longer than the delay provided by delay circuit 72A. As mentioned herein above, the velocity of signal propagation of transmission line 28A of FIG. 1 is M times larger than that of transmission line 28B. Thus the signal delay provided by transmission line 28B between the clock source and any deskewing circuit is M times longer than the delay of transmission line 28A. When delay circuits 72A and 72B are similar to circuit 32 of FIG. 5 the ratio M of delay between the two delay circuits can be established, for example, by using a different number of inverter stages in the two delay circuits. Also when the inverter stages are, for example, implemented by CMOS transistors, the delay ratio M can be finely adjusted by varying the channel widths of the CMOS transistors forming inverters 56 in a manner well known to those skilled in the art.

Figure 9:
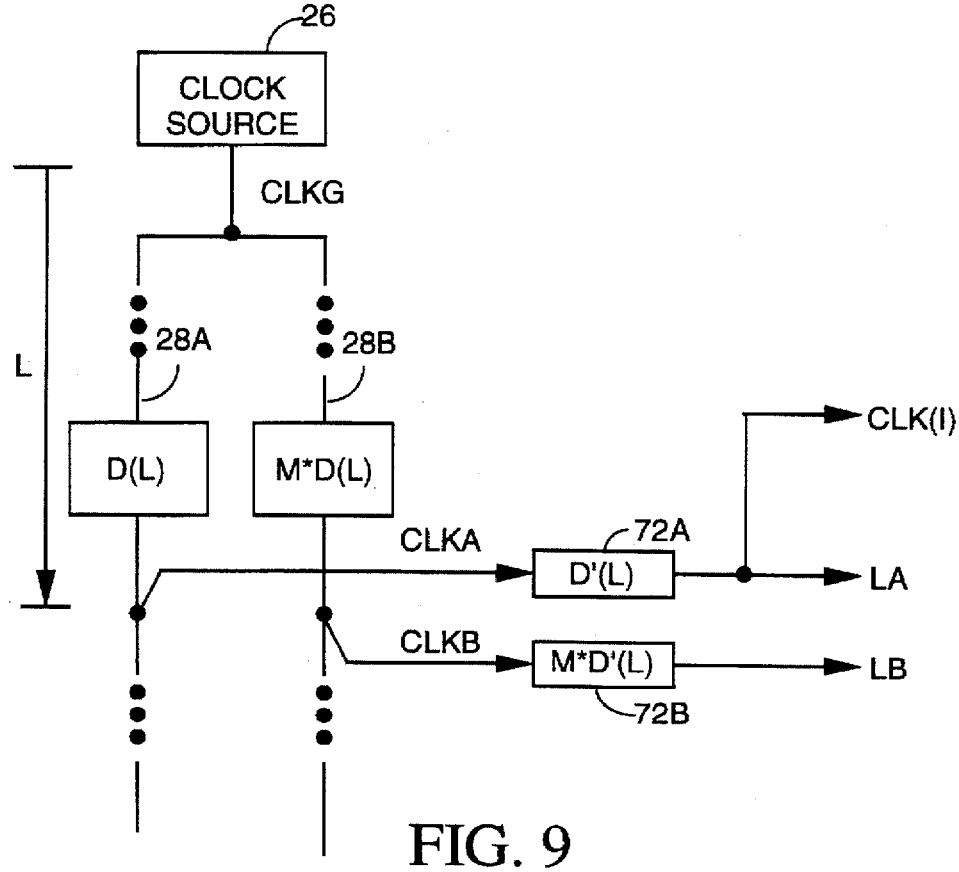
FIG. 9 is a block diagram illustrating clock signal delays in the deskewing system of FIG. 7.

FIG. 9 illustrates the signal delays in the circuit of FIG. 8. A local module taps lines 28A and 28B at a variable distance L from clock source 26 to obtain the CLKA and CLKB signals. The inherent signal delay D(L) in transmission line 26A between the tap and clock source 26 is linearly proportional to L. Since the velocity of signal propagation for transmission line 28A is M times greater than that of transmission line 28B, the inherent signal delay M*D(L) in line 28B is M times longer than the inherent signal delay D(L) in line 28A. (Herein the symbol "*" indicates multiplication.) The delay provided by delay circuit 72A is also a function of L and is represented in FIG. 9 as D'(L). Since for any given magnitude of VPLL the delay provided by delay circuit 72B of FIG. 7 is M times larger than the delay provided by delay circuit 72A, the delay of circuit 72B is M*D'(L).

As may be seen by inspection of FIG. 9, local clock LA is delayed from global clock CLKG at the output of clock source 20 by the sum of the delays D(L) and D'(L) of transmission line 28A and delay circuit 72A. Thus the phase of local clock LA with respect to CLKG is:

$$\text{PHASE}(LA) = [D(L)] + [D'(L)]. \qquad (1)$$

Similarly the phase of local clock LB with respect to global clock CLKG is $$\text{PHASE}(LB) = [M*D(L) + M*D'(L)]. \qquad (2)$$

The phase difference between LA and LB detected by phase detector 76 of FIG. 7 is therefore $$\text{PHASE}(B:A) = \text{PHASE}(LB) - \text{PHASE}(LA)$$

$$\text{PHASE}(B:A) = [M*D(L) + M*D'(L)] - [D(L) + D'(L)]$$

$$\text{PHASE}(B:A) = (M-1)*[D(L) + D'(L)] \qquad (3)$$

From equations (1) and (3) we have $$\text{PHASE}(LA) = D(L) + D'(L) = \text{PHASE}(B:A)/(M-1) \qquad (4)$$

The feedback control VPLL provided by phase detector 76 and differential amplifier 78 holds the phase difference PHASE(B:A) between local clocks LB and LA to a constant value determined by the voltage of the reference signal VREF supplied to amplifier 78. The feedback loop requires that VPH equals VREF. Since VPH is proportional to PHASE(B:A), PHASE(B:A) is fixed to whatever value is needed to make VPH equal VREF.

Since PHASE(B:A) and M are constants that are independent of L, then we see from equation (4) that PHASE (LA), the phase of local clock LA with respect to the global clock signal CLKG at the output of clock source 26, is also independent of L. This means that if a VREF signal of similar magnitude is supplied to the differential amplifiers 78 within all deskewing circuits, the local clock signal LA produced in all deskewing circuits of the system will have the same phase with respect to the global clock signal CLKG at the output of clock source 26. Since the LA signal is used as the local clock signal CLK(I) output to the local logic circuit, all local clock signals CLK(1)–CLK(N) of FIG. 1 will be in phase with one another and operations of local logic circuits 14(1)–14(N) will be closely synchronized.

The magnitude of VREF in FIG. 8 should be chosen so that the constant phase difference PHASE(B:A) between local clock signals LA and LB is equal to (M−1)*D(LMAX). LMAX is a distance along transmission lines 248 and 248 to a point that is farther from clock source 20 than the most distant local module transmission line taps. D(LMAX) is therefore the total inherent signal delay of transmission line 28A between clock source 20 and that distant point. The value of VREF should be selected to ensure that resulting delays DELAY(1)–DELAY(N) are positive and within the range of capability of internal delay circuits within the deskewing circuits 18(1)–18(N).

It can also be seen from equation (4) that the value of M, the ratio of velocities of propagation of the two transmission lines, should be larger than 1. One way of doing that when the transmission lines are implemented on backplane circuit board is to use a microstrip conductor for one transmission line and a stripline conductor for the other transmission line. A microstrip conductor is formed on top of the circuit board while a stripline conductor is sandwiched between layers of the circuit board. For example in G-10 Fiberglas boards having a relative dielectric constant of 5.0, the velocity of propagation for a microstrip conductor will be 565 pS/ft (picoseconds/foot) while the velocity of propagation for stripline conductor will be 442 pS/ft. Thus the velocity ratio M will be 1.28. The difference in signal delay between the two conductors is 68 pS per inch of transmission line length.

Figure 10:
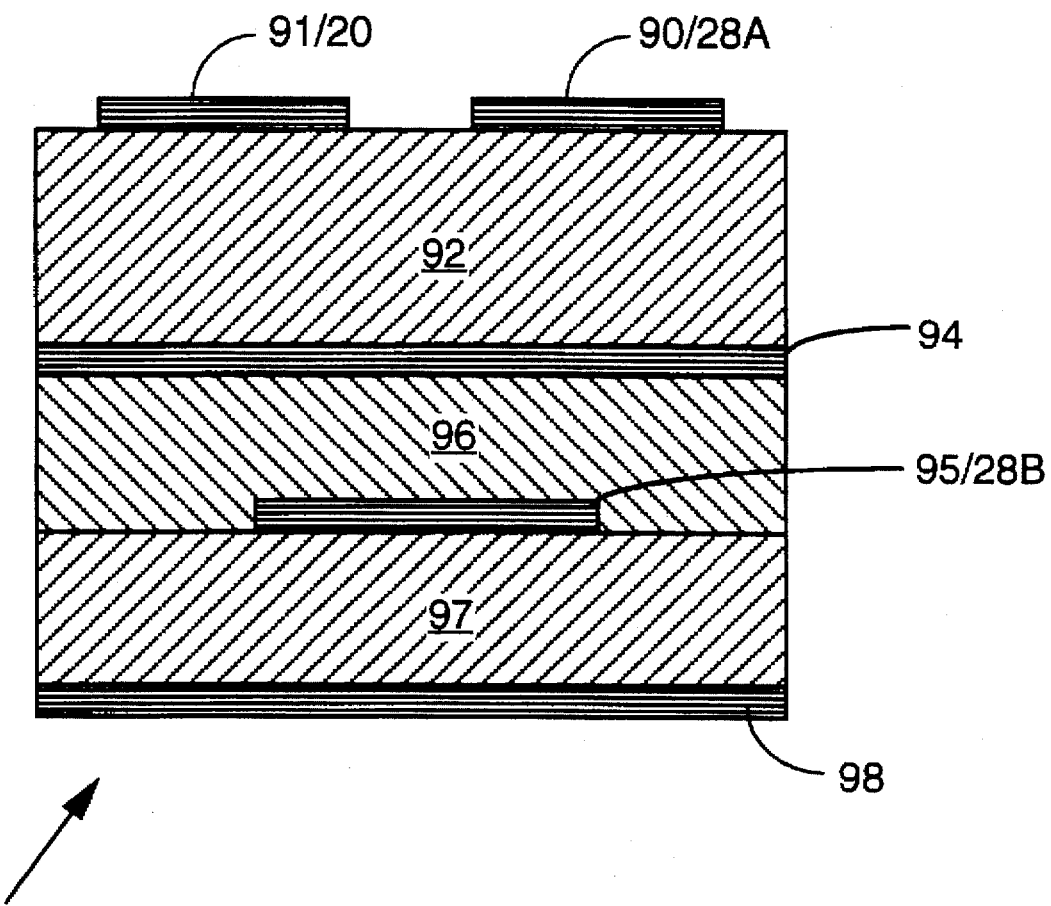
FIG. 10 is a cross-sectional illustration of a circuit board providing transmission lines of differing velocities of signal propagation.

We can increase M to improve deskewing resolution by employing circuit board layers having differing dielectric constants. FIG. 10 is a cross-sectional illustration of a multiple layer circuit board 89 wherein microstrip conductors 90 and 91 providing transmission line 28A and a line of bus 20 are formed on an upper FR4 dielectric layer 92 (relative dielectric constant=4.8) above a ground plane conductor 94. A strip line conductor 95 providing transmission line 28B is sandwiched between two Duroid dielectric layers 96 and 97 (relative dialectic constant=10) with a second ground plane 98 on the bottom of the circuit board. This arrangement yields a velocity of propagation ratio M of 1.82. The difference in signal delay between the two conductors is 120 pS per inch of transmission line length.

Thus has been described a signal deskewing system for a distributed synchronous logic circuit. While the forgoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

What is claimed is:

1. A method for producing a separate local clock signal at each of a plurality of modules of a distributed synchronous logic circuit in response to a global clock signal generated by a clock signal source, wherein the local clock signals are substantially in phase with one another, the method comprising the steps of:

continuously conveying the global clock signal from said clock signal source to each module via a transmission line while concurrently sensing a length of said transmission line between said clock signal source and each module; and delaying said global clock signal as it arrives at each module via said transmission line by a delay time that is a function of the sensed transmission line length between the clock signal source and the module, thereby to produce a separate local clock signal at each module.

2. The method in accordance with claim 1 wherein said delay time is inversely related to the sensed transmission line length.

3. A method for producing a separate local clock signal at each of a plurality of modules of a distributed synchronous logic system in response to a global clock signal generated by a clock signal source, wherein the local clock signals are substantially in phase with one another, the method comprising the steps of:

conveying the global clock signal from said clock signal source to each module via each of first and second transmission lines, the first and second transmission lines being of substantially equal length between the clock signal source and each module but having substantially dissimilar velocities of signal propagation;

sensing a length of said first and second transmission lines between said clock signal source and each module; and delaying said global clock signal as it arrives at each module on one of said first and second transmission lines by a delay time that is a function of the sensed transmission line length between that module and said clock signal source, thereby to produce a separate local clock signal at each module.

4. The method in accordance with claim 3 wherein said delay time is inversely related to the sensed transmission line length.

5. The method in accordance with claim 3 wherein the step of sensing a length of said first and second transmission lines between said clock signal source and each module comprises the step of comparing a phase of said global clock signal as it arrives at said each module via said first transmission line to a phase of said global clock signal as it arrives at said each module via said second transmission line.

6. The method in accordance with claim 3 wherein the steps of sensing a length of said first and second transmission lines and delaying said global clock signal comprises the substeps of:

comparing a phase of said global clock signal as it arrives at each module via said first transmission line to a phase of said global clock signal as it arrives at the module via said second transmission line to produce a first signal of magnitude representing said length;

generating a second signal in response to said first signal wherein a magnitude of said second signal is a predetermined function of the magnitude of said first signal; and passing said global clock signal through a delay circuit to produce said local clock signal after said global clock signal arrives at said module via one of said first and second transmission lines, the delay circuit delaying said global clock signal by said delay time, said delay time being controlled in accordance with a magnitude of said second signal provided as control input to said delay circuit.

7. The method in accordance with claim 6 wherein the step of generating said second signal comprises the substeps of:

storing data values at separate addresses of an addressable memory;

addressing said addressable memory in accordance with the magnitude of said first signal such that said addressable memory reads out one of said stored data values; and producing said second signal magnitude in accordance with the read out data value.

8. A method for producing a separate local clock signal at each of a plurality of modules of a synchronous logic system in response to a global clock signal generated by a clock signal source, the method comprising the steps of:

conveying the global clock signal from said clock signal source to each module via each of first and second transmission lines;

delaying said global clock signal as it arrives at each module via said first transmission line by an adjustable first delay time, thereby to produce a first local clock signal at the module;

delaying said global clock signal as it arrives at each module via said second transmission line by an adjustable second delay time, thereby to produce a second local clock signal at the module; and adjusting said first and second delay times in each module to provide a predetermined phase relation between the first and second local clock signals produced at each module.

9. The method in accordance with claim 8 wherein the first and second transmission lines are of substantially equal length between the clock signal source and each module but wherein a velocity of global clock signal propagation of said first transmission line is M times that of a velocity of global clock signal propagation of said second transmission line, where M is a number other than one.

10. The method in accordance with claim 9 wherein a ratio of said second delay time to said first delay time is substantially equal to M for each module.

11. An apparatus for producing a separate local clock signal at each of a plurality of modules of a synchronous logic system in response to a global clock signal generated by a clock signal source, the apparatus comprising:

a transmission line for conveying the global clock signal from said clock signal source to each module; and deskewing means for continuously sensing a length of said transmission line between said clock signal source and each module and for concurrently delaying said global clock signal as it arrives at each module via said transmission line by a delay time that is a function of the sensed transmission line length between the module and said clock signal source, thereby to produce the local clock signal at the module.

12. The apparatus in accordance with claim 11 wherein said delay time in each module is inversely related to the sensed transmission line length between the clock signal source and the module.

13. An apparatus for producing separate local clock signals to a plurality of modules of a synchronous logic system in response to a global clock signal generated by a clock signal source, wherein the local clock signals are substantially in phase with one another, the apparatus comprising:

a first transmission line for conveying the global clock signal from said clock signal source to each module;

a second transmission line for conveying the global clock signal from said clock signal source to each module, the first and second transmission lines, the first and second transmission lines being of substantially equal length between the clock signal source and each module but having substantially dissimilar velocities of global clock signal propagation; and deskewing means associated with each module for sensing a length of said first and second transmission lines between said clock signal source and its associated module and delaying said global clock signal as it arrives at its associated module on one of said first and second transmission lines by a delay time that is a function of the sensed transmission line length.

14. The apparatus in accordance with claim 13 wherein said delay time is inversely related to the sensed transmission line length.

15. The apparatus in accordance with claim 13 wherein said deskewing means comprises means for comparing a phase of said global clock signal as it arrives at the associated module via said first transmission line to a phase of said global clock signal as it arrives at the associated module via said second transmission line.

16. The apparatus in accordance with claim 13 wherein said deskewing means comprises:

means for comparing a phase of said global clock signal as it arrives at the associated module via said first transmission line to a phase of said global clock signal as it arrives at the associated module via said second transmission line to produce a first signal of magnitude representing said length;

means for generating a second signal in response to said first signal wherein a magnitude of said second signal is a predetermined function of the magnitude of said first signal; and delay means for delaying said global clock signal by said delay time after said global clock signal arrives at said module via one of said first and second transmission lines to produce said local clock signal, said delay time being controlled in accordance with the magnitude of said second signal supplied as input to said delay means.

17. The apparatus in accordance with claim 16 wherein said means for generating said second signal comprises:

an addressable memory for storing data values at separate addresses;

means for addressing said addressable memory in accordance with the magnitude of said first signal such that said addressable memory reads out an addressed one of said stored data values; and means for producing said second signal magnitude in accordance with the read out data value.

18. An apparatus for producing a separate local clock signal at each of a plurality of modules of a synchronous logic system in response to a global clock signal generated by a clock signal source, wherein the local clock signals are substantially in phase with one another, the apparatus comprising:

a first transmission line for conveying the global clock signal from said clock signal source to each module;

first delay means associated with each module for delaying said global clock signal as it arrives at each module via said first transmission line by an adjustable first delay time, thereby to produce a first local clock signal for the associated module;

second delay means associated with each module for delaying said global clock signal as it arrives at each module via said second transmission line by an adjustable second delay time, thereby to produce a second local clock signal at the module; and means associated with each module for adjusting said first and second delay times of the first and second delay means associated with the module to provide a predetermined phase relation between the first and second local clock signals of the associated module.

19. The apparatus in accordance with claim 18 wherein a velocity of global clock signal propagation of said first transmission line is M times that of a velocity of global clock signal propagation of said second transmission line, where M is a number varying substantially from one.

20. The apparatus in accordance with claim 19 wherein a ratio of the second delay time of said second delay means to the first delay time of said first delay means is substantially equal to M.

21. For a synchronous logic system comprising a host unit and a plurality of logic modules distant from the host unit, wherein the host unit includes a clock signal source generating a global clock signal, a method for producing a separate local clock signal at each module and for conveying data signals between said host unit and each module, the method comprising the steps of:

conveying the global clock signal from said clock signal source to each module via a transmission line;

sensing a length of said transmission line between said clock signal source and each module;

delaying said global clock signal as it arrives at each module via said transmission line by a delay time that is a function of the sensed transmission line length between said clock signal source and said module, thereby to produce the local clock signal at that module;

conveying data signals between the host unit and each of said modules via a data line; and delaying said data signals at each of said modules by said delay time that is a function of the sensed transmission line length between said clock signal source and said module.

22. An apparatus for producing separate local clock signals at a plurality of modules of a synchronous logic system in response to a global clock signal generated by a clock signal source within a host unit of the synchronous logic system, and for conveying data signals between the host unit and each of said modules, the apparatus comprising:

a first transmission line for conveying the global clock signal from said clock signal source to each module;

a second transmission line for conveying the global clock signal from said clock signal source to each module, the first and second transmission lines;

a data line for conveying said data signals between said host unit and each of said modules; and deskewing means associated with each module for sensing a phase difference between the global clock signal arriving at the at the associated module on said first and second transmission lines, delaying the global clock arriving at one of said first and second transmission lines at the associated module by a delay time that is a function of the sensed phase difference, thereby to produce a local clock signal at the associated module, and for conveying said data signals between said data line and the associated module with a delay equal to said delay time.

23. The apparatus in accordance with claim 22 wherein the first and second transmission lines and said data line are of substantially equal length between the clock signal source and each module but wherein a velocity of global clock signal propagation of said first transmission line is M times that of a velocity of global clock signal propagation of said second transmission line, where M is a number other than one, and wherein a velocity of data signal propagation of said data line is substantially equal to that of said first transmission line.

24. An apparatus for producing a separate local clock signal at each of a plurality of modules of a synchronous logic system in response to a global clock signal generated by a clock signal source, for conveying data signals between the host unit and each of said modules, the apparatus comprising:

a first transmission line for conveying the global clock signal from said clock signal source to each module;

a second transmission line for conveying the global clock signal from said clock signal source to each module;

first delay means associated with each module for delaying said global clock signal as it arrives at each module via said first transmission line by an adjustable first delay time, thereby to produce a first local clock signal for the associated module;

second delay means associated with each module for delaying said global clock signal as it arrives at each module via said second transmission line by an adjustable second delay time, thereby to produce a second local clock signal at the module;

third delay means associated with each module for delaying said data signals between said data line and the associated module by said an adjustable first delay time; and means associated with each module for adjusting said first and second delay times to provide a predetermined phase relation between the first and second local clock signals of the associated module, wherein a velocity of global clock signal propagation of said first transmission line is M times that of a velocity of global clock signal propagation of said second transmission line, where M is a number varying substantially from one, wherein a velocity of signal propagation of the data line is substantially equal to the velocity of propagation of the first transmission line and wherein a ratio of the second delay time to the first delay time in each module is substantially equal to M.

25. An apparatus for generating an output signal indicating a magnitude of signal skew in a first transmission line comprising:

a pulse generator for generating an electrical pulse;

a phase detector, the first transmission line conveying said pulse from said pulse generator to said phase detector; and a second transmission line for separately conveying said pulse from said pulse generator circuit to said phase detector, wherein the first and second transmission lines have similar length between said pulse generator and said phase detector but have dissimilar velocities of signal propagation, wherein the phase detector produces an output signal indicating a phase difference between arrival times of said pulse on said first and second transmission lines, and wherein said phase difference is proportional to a magnitude of signal skew in said first transmission line between said pulse generator and said phase detector.

* * * * *